United States Patent [19]
Nguyen et al.

[11] Patent Number: 5,949,282
[45] Date of Patent: Sep. 7, 1999

[54] CLASS D AMPLIFIER NO LOW PASS FILTER FEEDBACK WITH ZERO PHASE DELAY

[75] Inventors: Huey Nguyen; Hideto Takagishi, both of San Jose, Calif.

[73] Assignee: National Semiconductor Corporation, Santa Clara, Calif.

[21] Appl. No.: 09/030,746

[22] Filed: Feb. 25, 1998

[51] Int. Cl.⁶ .................................................. H03F 3/38
[52] U.S. Cl. ........................................ 330/10; 330/207 A
[58] Field of Search ................................. 330/10, 207 A, 330/251, 85

[56] References Cited

U.S. PATENT DOCUMENTS

| | | | |
|---|---|---|---|
| 4,004,246 | 1/1977 | Hamada | 330/10 |
| 5,410,592 | 4/1995 | Wagner et al. | 379/388 |
| 5,610,553 | 3/1997 | Kirn | 330/10 |
| 5,805,020 | 9/1998 | Danz et al. | 330/10 |

*Primary Examiner*—Robert Pascal
*Assistant Examiner*—Henry Choe
*Attorney, Agent, or Firm*—Skjerven, Morrill, MacPherson, Franklin & Friel; Edward C. Kwok

[57] ABSTRACT

A circuit for generating an accurate reproduction of the output of a Class D amplifier for error-correction purposes includes a reference signal amplifier circuit. The reference signal amplifier circuit includes an op-amp configured as a differential amplifier that combines the digital outputs of the internal output stage of the amplifier into a single reference signal. By reducing the bandwidth of the op-amp, switching noise is removed from the digital signals, without adding any phase shift to the generated reference signal. In addition, by using the digital signals directly from the output stage rather than the filtered analog outputs of the amplifier, distortion due to external speaker-induced back-EMF is prevented. The reference signal can then be compared to the original signal input to the amplifier for error-correcting purposes.

6 Claims, 3 Drawing Sheets

CLASS D AMPLIFIER NO LOW PASS FILTER FEEDBACK WITH ZERO PHASE DELAY

BACKGROUND OF THE INVENTION

1. Field of the Invention

The present invention relates to Class D amplifiers, and in particular, to an output signal reproduction circuit with zero phase delay.

2. Discussion of the Related Art

In a Class D amplifier, an input audio signal is transformed into an output signal capable of being reproduced into the original signal on an external load, usually a speaker. The basic operation of a Class D amplifier is shown in FIG. 1. An incoming analog signal AUDIO_IN is converted by a pulse-width modulator, PWM 101, into a high-frequency rectangular wave DIG_OUT, the average value of which tracks the original signal. Rectangular wave DIG_OUT is fed into an output stage 102, which provides level shifting and splits the signal into a driving signal HI_OUT and a driving signal LO_OUT. Signal HI_OUT and signal LO_OUT are sent through output filters 103 and 104, respectively, to remove switching noise and provide an averaged output to drive a speaker 105. Output filters 103 and 104 are typically implemented as LC filters, as shown in FIG. 3a. An output filter 301 contains an inductor 302 and a capacitor 303 and acts as a low-pass filter on the signal going from output stage 102 to speaker 105.

In order to improve the accuracy of the output signal of a typical Class D amplifier, a feedback loop is used to monitor the output and provide slight adjustments as required. As shown in FIG. 2a, an example of this feedback loop includes a feedback amplifier circuit 206 and an error amplifier circuit 207. Feedback amplifier circuit 206 recombines the outputs of filters 103 and 104 into a single reference signal REF_SIGNAL. Signal REF_SIGNAL is then compared to the original signal AUDIO_IN by an error amplifier circuit 207, which then generates an adjusted signal ADJ_OUT that corrects for any discrepancies. Adjusted signal ADJ_OUT is then processed normally by PWM 101, and the cycle continues. Another example of the feedback loop is shown in FIG. 2b. Two external feedback filters 203 and 204 read signals HI_OUT and LO_OUT, respectively, directly from output stage 102. Filters 203 and 204 typically contain an LC or RC circuit, as shown in FIG. 3b. In FIG. 3b, a feedback filter 304 includes a resistor 305 and a capacitor 306 arranged as a low-pass filter. Like filters 103 and 104, filters 203 and 204 remove switching noise and average the digital signals, and feedback amplifier circuit 206 combines their outputs to create signal REF_SIGNAL for error amplifier circuit 207.

In the feedback loop implementations shown in FIGS. 2a and 2b, the accuracy of signal REF_SIGNAL is critical in determining overall amplifier precision. If signal REF_SIGNAL exhibits excessive distortion or phase delay, it cannot be validly compared to incoming signal AUDIO_IN by error amplifier circuit 207, making error compensation useless or even detrimental. Distortion of signal REF_SIGNAL is typically caused by switching noise from output stage 102 and back-EMF from speaker 105. Switching noise is a side effect of the normal operation of the power FET's in output stage 102, which are constantly cycling on and off in accordance with the output of PWM 101. This generates sharp current peaks and high-frequency noise that can couple to the basic output signal. Filters 103 and 104, and 203 and 204, are designed to remove switching noise by acting as low-pass filters, and often contain multiple filter stages to improve high-frequency rejection. However, the "clean" signal needed by error amplifier circuit 207 can impose a requirement for filter stages beyond those necessary for accurate sound reproduction at speaker 105. The additional filter stages add complexity and cost to the amplifier circuit, especially for the external filter implementation of FIG. 2b. However, the reason behind external filters 203 and 204 is to address the other potential source of signal distortion, back-EMF from speaker 105. Large displacements of the cone in speaker 105 can generate back-EMF in its voice coil, distorting the driving waveform. By decoupling external filters 203 and 204 from speaker 105, the effects of back-EMF are minimized, though at the cost of increased part count.

The other critical factor in amplifier precision is the phase delay of signal REF_SIGNAL. If a phase difference exists between signals REF_SIGNAL and AUDIO_IN, the instantaneous magnitudes of the signals will differ even if the waveforms are identical in all other respects. This difference will be seen as an error by error amplifier circuit 207 and can lead to unwanted oscillations and distortions of the output signal as error amplifier circuit 207 attempts to "correct" a signal that may already match the original signal. Because of the discrete components in the filters that generate the output signals used by the feedback loop, phase shift is inevitable in conventional Class D amplifiers. The capacitances in filters 103, 104, 203, and 204 ensure a certain amount of phase delay in signal REF_SIGNAL. This amount can be reduced by increasing filter capacitor size, but this increase also lowers the cut-off frequency of the filter and can have a detrimental effect on the frequency response of the amplifier.

Accordingly, it is desirable to provide a feedback amplifier circuit that is capable of providing accurate reproduction of amplifier output while introducing minimal phase shift.

SUMMARY OF THE INVENTION

The present invention provides, in a Class D amplifier, a reference signal amplifier circuit for accurately reproducing the output signal of the amplifier within an error-correcting feedback loop circuit. According to the present invention, the reference signal amplifier is directly connected to the output stage of the amplifier. An op-amp configured as a differential amplifier circuit in the feedback loop circuit combines the digital signals from the output stage of the amplifier into a single reference signal. By reducing the bandwidth of the op-amp, the differential amplifier circuit behaves like a low-pass filter, effectively rejecting any switching noise. In addition, by directly coupling to the output stage of the amplifier, the influence of any potentially disruptive back-EMF from an external speaker is minimized. Finally, because discrete RC or LC filters are not used to generate the reference signal, no phase shift is introduced into the reference signal. This leads to the generation of an accurate reference signal that can properly be compared to the original input signal to the amplifier for error-correction purposes.

This invention will be more fully understood after consideration of the following detailed description taken along with the accompanying drawings.

BRIEF DESCRIPTION OF THE DRAWINGS

Use of the same reference numbers in different figures indicates similar or like elements.

DETAILED DESCRIPTION OF THE INVENTION

Figure 1:
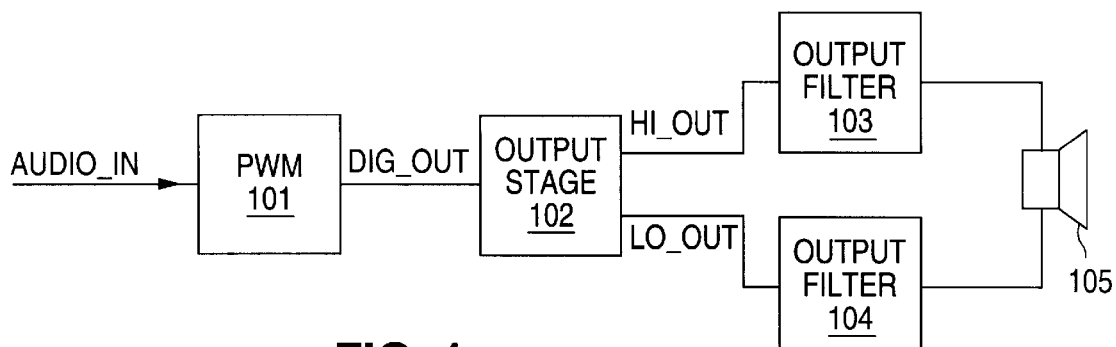
FIG. 1 is a block diagram of basic Class D amplifier operation.
Figure 3A:
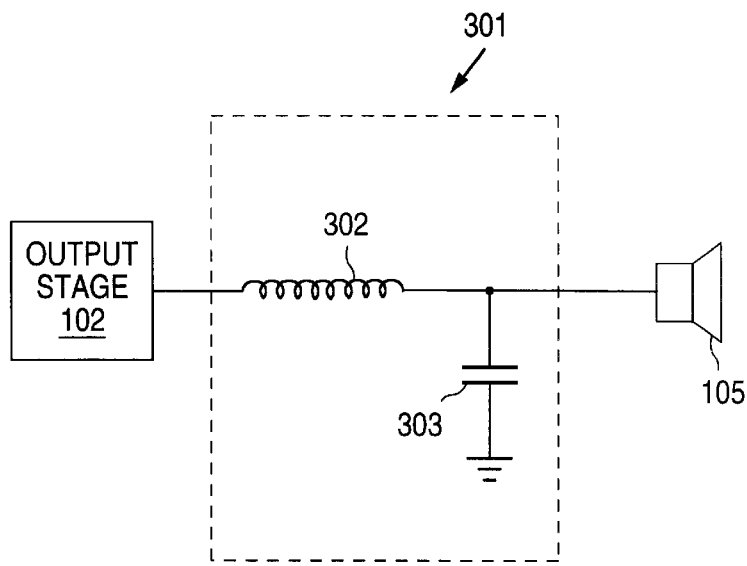
FIG. 3a is an implementation of an output filter.
Figure 3B:
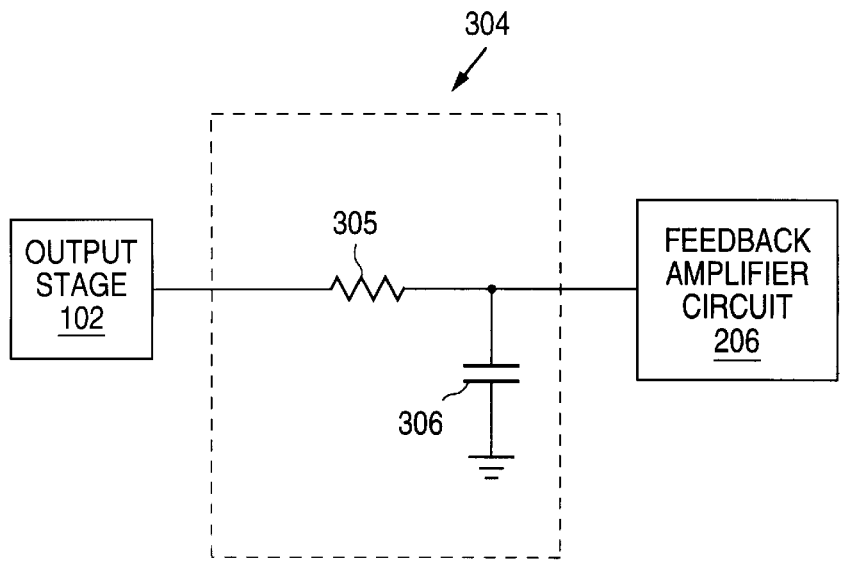
FIG. 3b is an implementation of a feedback filter.
Figure 2A:
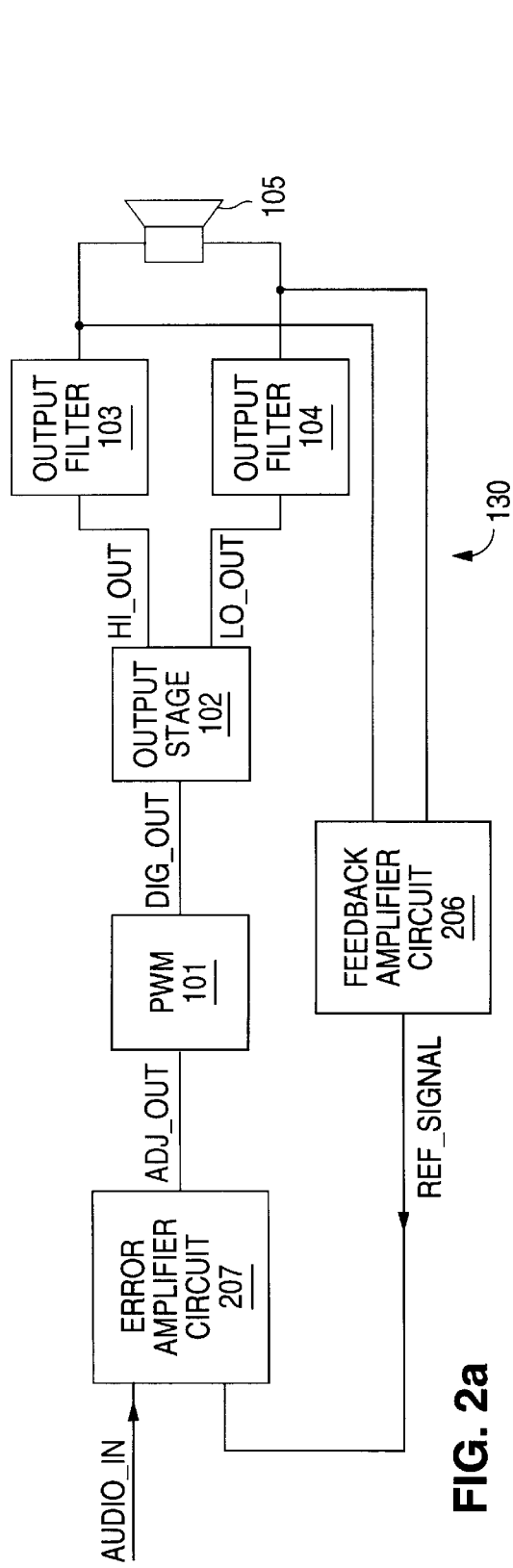
FIG. 2a is a block diagram of a conventional feedback loop in a Class D amplifier.
Figure 2B:
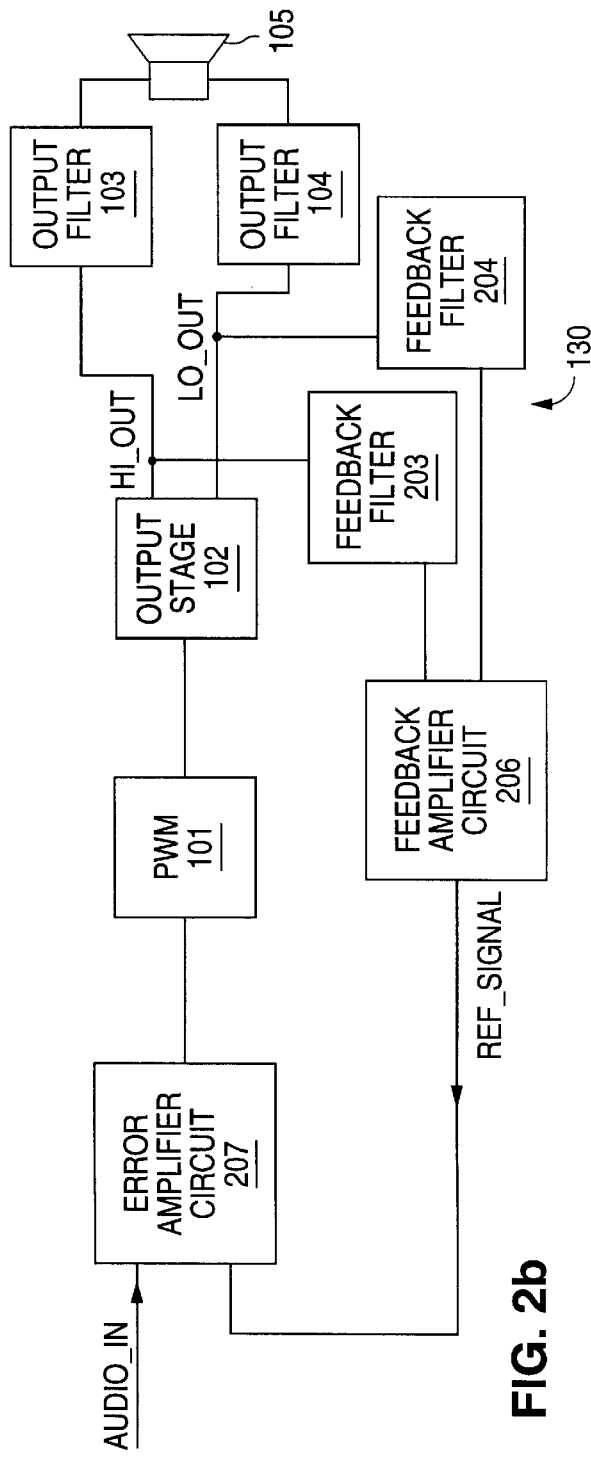
FIG. 2b is a block diagram of another conventional feedback loop in a Class D amplifier.
Figure 4:
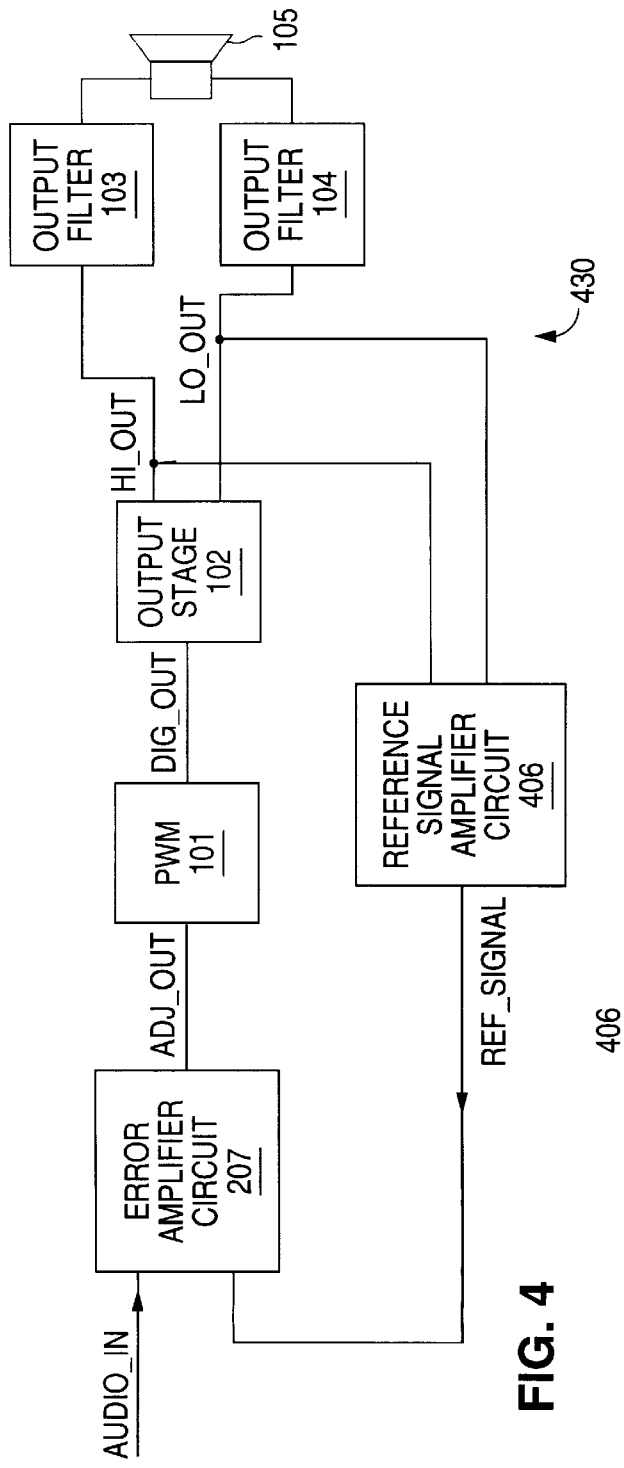
FIG. 4 is a block diagram of a feedback loop in a Class D amplifier using the present invention.
Figure 5:
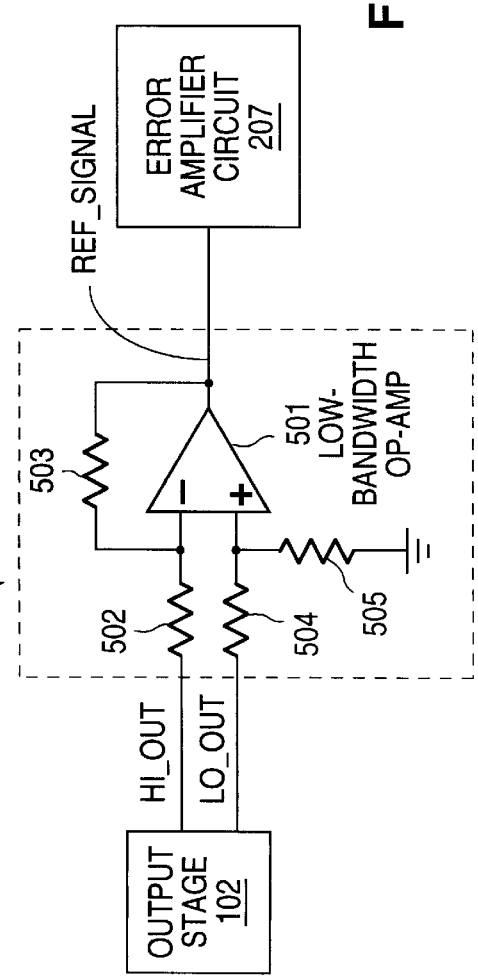
FIG. 5 is a schematic circuit diagram of the present invention.

The present invention provides a feedback loop for a Class D amplifier that generates an accurate, low-delay reproduction of the output signal for comparison with the original input signal. An embodiment of the present invention is shown in FIG. 4. As in a conventional Class D amplifier, an analog input signal AUDIO_IN is fed into an error amplifier circuit 207 that adjusts signal AUDIO_IN. The resultant signal ADJ_OUT is transformed into a high-frequency digital signal DIG_OUT by a pulse-width modulator, or PWM 101. An output stage 102 provides level shifting and splits signal DIG_OUT into a driving signal HI_OUT and a driving signal LO_OUT. Output filters 103 and 104 remove switching noise and convert the digital signals HI_OUT and LO_OUT, respectively, back into analog signals capable of driving an external speaker 105. In order to ensure proper error-correction performance by error amplifier circuit 207, the present invention provides a reference signal amplifier circuit 406. Circuit 406 takes signals HI_OUT and LO_OUT directly from output stage 102 and combines them into a single reference signal REF_SIGNAL. An embodiment of reference signal amplifier circuit 406 is shown in FIG. 5. A low-bandwidth op-amp 501 is configured as a differential amplifier by resistors 502, 503, 504, and 505. By reducing the bandwidth of op-amp 501 so that its gain rolls off at a desired filtering frequency, the high-frequency switching noise can be eliminated. At the same time, as long as the rolloff frequency is greater than the frequencies of signals HI_OUT and LO_OUT, the output signal is passed without any phase shift. Therefore, an output signal REF_SIGNAL is produced that is in phase with original input signal AUDIO_IN. Signal REF_SIGNAL generated by circuit 406 and signal AUDIO_IN can thus be properly compared by error amplifier circuit 207 to obtain accurate results for error-correction. In addition, circuit 406 avoids the distorting effects of back-EMF from speaker 105 without requiring the additional filters 203 and 204 shown in FIG. 2b.

We claim:

1. A Class D amplifier, comprising:

a pulse-width modulator for converting an input audio signal into a digital waveform;

an output stage for applying signal splitting and level shifting to said digital waveform to produce high and low digital driving signals; and an error amplifier circuit for comparing the output signal of said Class D amplifier to said input audio signal for error-correction purposes;

a reference signal amplifier circuit directly coupled to said output stage for filtering noise from said high and low digital driving signals, and combining said high and low digital driving signals into a single analog reference signal, said reference signal amplifier circuit having a roll-off frequency greater than the frequencies of said high and low digital driving signals.

2. The circuit of claim 1 comprising a low-bandwidth op-amp configured as a differential amplifier.

3. The circuit of claim 2 wherein said low-bandwidth op-amp has a rolloff frequency substantially less than the frequency of switching noise generated by said output stage.

4. In a Class D amplifier having a pulse-width modulator for converting an incoming audio signal into a digital waveform, and an output stage for applying signal-splitting and level-shifting to said digital waveform to produce high and low digital driving signals, a method, comprising the steps of:

reading said high and low digital driving signals directly from said output stage;

filtering out switching noise from said high and low digital driving signals; and combining said high and low digital driving signals into a single reference signal using a reference signal amplifier circuit having a roll-off frequency greater than the frequencies of said high and low digital driving signals.

5. The method of claim 4 wherein said filtering, averaging and combining steps are performed by a low-bandwith op-amp configured as a differential amplifier.

6. The method of claim 5 wherein said low-bandwidth op-amp has a rolloff frequency substantially less than the frequency of said switching noise.

* * * * *